United States Patent
Grebner et al.

(10) Patent No.: US 6,897,646 B2
(45) Date of Patent: May 24, 2005

(54) METHOD FOR TESTING WAFERS TO BE TESTED AND CALIBRATION APPARATUS

(75) Inventors: Thomas Grebner, Freising (DE); Hans-Christoph Ostendorf, Munich (DE); Michael Schittenhelm, Poing (DE); Erwin Thalmann, Munich (DE)

(73) Assignee: Infineon Technologies AG, München (DE)

(*) Notice: Subject to any disclaimer, the term of this patent is extended or adjusted under 35 U.S.C. 154(b) by 69 days.

(21) Appl. No.: 10/225,617

(22) Filed: Aug. 22, 2002

(65) Prior Publication Data

US 2003/0076126 A1 Apr. 24, 2003

(30) Foreign Application Priority Data

Aug. 22, 2001 (DE) .......................................... 101 41 025

(51) Int. Cl.⁷ ............................................... G01R 31/26
(52) U.S. Cl. .................................... 324/158.1; 324/765
(58) Field of Search ............................. 324/158.1, 765, 324/760, 763; 702/85, 108, 127; 438/14–18

(56) References Cited

U.S. PATENT DOCUMENTS

| | | | |
|---|---|---|---|
| 4,497,056 A | 1/1985 | Sugamori | |
| 4,724,378 A | 2/1988 | Murray et al. | |
| 5,539,324 A | 7/1996 | Wood et al. | |
| 5,589,765 A | * 12/1996 | Ohmart et al. | ........... 324/158.1 |
| 5,712,855 A | 1/1998 | Goto et al. | |
| 6,146,908 A | 11/2000 | Falque et al. | |

FOREIGN PATENT DOCUMENTS

DE 19817763 C2 2/2001

* cited by examiner

*Primary Examiner*—Vinh P. Nguyen
(74) *Attorney, Agent, or Firm*—Jenkins, Wilson & Taylor, P.A.

(57) ABSTRACT

The invention provides a method for testing wafers (101) to be tested in a test device (100), in which the test device (100) can be calibrated, at least one calibration wafer (102) being automatically introduced into the test device (100) by means of a handling unit (103), calibration values of the test device (100) being determined by means of a control by a calibration sequence control unit (105), the calibration values determined being stored in a memory unit (106), the test device (100) being calibrated by means of the stored calibration values, the calibration wafer (102) being output from the calibrated test device (100), and at least one wafer (101) to be tested being introduced into the calibrated test device (100) by means of the handling unit (103) and being tested by a control by means of a test sequence control unit (104) in the calibrated test device (100), the stored calibration values being applied.

10 Claims, 5 Drawing Sheets

METHOD FOR TESTING WAFERS TO BE TESTED AND CALIBRATION APPARATUS

TECHNICAL FIELD

The present invention relates to a method for testing wafers to be tested in a test device and relates in particular to a method for testing wafers to be tested in a test device which can be calibrated with a calibration wafer.

BACKGROUND ART

Conventional test devices require signal profiles to be calibrated with regard to their levels and time or phase relationships. Signal propagation times of test signals deviate both within a test device and during a signal transmission from the test device to the wafers to be tested, which may contain semiconductor components to be tested.

Furthermore, during the testing of wafers to be tested, one problem is that the different signal propagation times of signals from the component to be tested (wafer to be tested) back to the test device must likewise be compensated for. Calibration of test devices becomes absolutely necessary in particular when the deviations caused by signal propagation times are of the same order of magnitude as a typical cycle time of the components to be tested on a wafer to be tested, since otherwise correct testing of components to be tested becomes impossible.

In conventional test devices variable delay elements are arranged for the compensation of different signal propagation times, which elements are set during a calibration of a test device in such a way that propagation time differences are minimized or eliminated.

FIG. 4 diagrammatically shows a flow diagram for the testing of a wafer to be tested in a conventional test device. A connection of peripheral units, such as, for example, suitable measuring instruments (oscilloscope, voltmeter and ammeter, propagation time difference, time difference and phase difference measuring units, etc.), is required in a conventional manner.

A test or calibration sequence begins at a step S401.

In a step S402, firstly the abovementioned peripheral units are connected in order to be able to carry out corresponding propagation time measurements, phase difference measurements, time difference measurements, etc.

Essentially two different methods are used in a conventional manner:

(i) A Reflection Measurement (Time Domain Reflectometry, TDR):

In this case, firstly driver units of the test device are measured, i.e. a signal path from the test device to a wafer to be tested or to a component to be tested. For this purpose, contacts at an interface of the component to be tested are either left unconnected or short-circuited to ground.

It follows from this that the signals proceeding from driver units are reflected (reflection measurement) at the interface of the module to be tested. A temporal difference (propagation time difference, phase difference, time difference) between the originally emitted signals and the reflected signals is determined by a suitable measuring device, whereupon compensation of existing propagation time differences is made possible.

A significant disadvantage of the TDR method is that a reflected signal is generally disturbed or impaired by discontinuities of a characteristic impedance on the signal path, this disturbance being caused in particular by the fact that the reflected signal disadvantageously has to pass through the signal path twice.

During an automatic determination of a temporal position of the reflected signal with regard to a reference signal, this results in an unacceptable error. Further errors occur in the conventional method for calibrating a test device by virtue of the fact that an ideal short circuit (connection to ground) or an ideal open circuit (unconnected state) cannot be achieved at an interface of a module to be tested, as a result of which a signal waveform is subject to modifications.

A further disadvantage of the TDR method is that, for each individual measurement, it is necessary to wait for a complete go and return passage of the signal from the test device to the component to be tested (the wafer to be tested) and back from there, in order to carry out a time difference measurement, for example. This inexpediently restricts a maximum repetition rate and a practically achievable statistical stability of the measurement results.

It is furthermore disadvantageous that the TDR method can be parallelized only to a very limited extent, so that a calibration time rises with a rising number of signal paths.

(ii) Method Using an External Measuring Instrument (e.g. an Oscilloscope)

In this case, one or more input connections of the measuring instrument are connected via a suitable device to each individual output connection of an interface of the module to be tested, for which purpose a robot arm or a relay matrix has to be provided in the case of automatic test devices. In this case, it is particularly disadvantageous that a calibration requires a very long time, since individual signal paths (channels) have to be measured sequentially. Together with considerable setup times when using external calibration equipment, this method is highly inefficient.

After a calibration effected in a step S403, the processing proceeds to a step S404. In step S404, a wafer to be tested is introduced into the test device and subsequently tested in a step S405.

The test result, which comprises, in particular, propagation time differences in signal paths to be tested, is evaluated in a step S406. In a step S407, an interrogation is effected to determine whether or not predeterminable criteria are met in respect of a quality of a calibration of the test device. A calibration quality can be determined using measurement results of a multiplicity of wafers. A decision as to whether a renewed calibration is necessary arises, for example, from a calibration validity duration prescribed by the manufacturer of the test device, or from considerations of the test results of wafers to be tested. If it is then determined that a calibration is necessary, the processing proceeds to step S402, in order to run through a renewed calibration mode. If the criteria entered into step S407 are met, then the processing proceeds to a step S408, in which an interrogation is effected to determine whether a next wafer is to be tested.

If it is ascertained in step S408 that a next wafer is to be tested, then the processing proceeds to a step S409, in which a new wafer to be tested is provided. The new wafer to be tested which is provided in step S409 is introduced into the test sequence of the test device in step S404.

If it is ascertained in step S408 that no further wafers are to be tested, then the processing proceeds to a step S410, in which the test sequence in the test device is ended.

It is a particular disadvantage of conventional methods for testing wafers to be tested that between a calibration sequence and a test sequence there are considerable differences in respect of the test sequence, the test environment, the test geometry, etc.

In a disadvantageous manner, it is not possible to integrate a calibration sequence with sufficient accuracy in an automatic test sequence in a test device, since, on the one hand, extensive reflection measurements (described above under (i)) have to be carried out, or a considerable outlay is necessary in the case of a connection of peripheral units (described above under point (ii) and with reference to FIG. 4). In order to provide a calibration with a sufficient accuracy, manual procedure has to be effected in the case of calibration methods according to the prior art.

SUMMARY OF THE INVENTION

Therefore, it is an object of the present invention to integrate a calibration sequence of a test device which serves for testing wafers to be tested into existing test sequences in a simple manner, the calibration method having a high accuracy.

This object is achieved according to the invention by means of the method specified in patent claim 1 and by means of a calibration wafer.

Further refinements of the invention emerge from the subclaims.

An essential concept of the invention is that, in a test device, there is no difference between a test sequence during the testing of wafers to be tested and a calibration sequence during the calibration of the test device, i.e. a geometry of a test device and contact-making connections are identical during a calibration sequence and during a test sequence.

For this purpose, a calibration wafer which, in respect of a geometry and in respect of contact-making connections, is identical to a wafer to be tested is introduced into the test device, in which case all of the relevant calibration sequences for the calibration of the test device can be carried out with the calibration wafer.

The invention's method for testing wafers to be tested in a test device, in which the test device can be calibrated, essentially has the following steps:

a) Introduction of a calibration wafer, which, in terms of its geometry and in terms of its contact-making connections, corresponds to a wafer to be tested, into the test device by means of a handling unit, which may be designed as a robot arm;
b) Determination of calibration values (propagation time differences, phase differences, time differences, etc.) in the test device by means of a control by a calibration sequence control unit, the calibration sequence control unit being formed by specific components of a test device in conjunction with a control program provided by a user;
c) Storage of the calibration values determined in a memory unit;
d) Calibration of the test device by means of the stored calibration values, recourse being had to the values stored in the memory unit;
e) Outputting of the calibration wafer from the calibrated test device by means of the handling unit;
f) Introduction of a wafer to be tested into the calibrated test device by means of the handling unit; and
g) Testing of the wafer to be tested in the calibrated test device by means of a control by a test sequence control unit, the stored calibration values being used.

Advantageous developments and improvements of the respective subject matter of the invention are found in the subclaims.

In accordance with one preferred development of the present invention, the wafer to be tested and the calibration wafer are automatically introduced into the test arrangement, or output from the latter, in a test sequence, an automatic handling unit advantageously being used.

In accordance with a further preferred development of the present invention, propagation time values are determined as calibration values of the test device, said propagation time values determining propagation time differences in signal paths between the test device and a component to be tested of the wafer to be tested.

In accordance with yet another preferred development of the present invention, phase difference values on signal paths are determined as calibration values of the test device.

In accordance with yet another preferred development of the present invention, at least one calibration wafer is introduced into the test device in a predeterminable manner during at least one test sequence, wafers to be tested advantageously being tested before a calibration sequence and after a calibration sequence. If it is determined after a preceding test sequence that a calibration is necessary, said calibration is always performed before a test of a wafer to be tested.

In accordance with yet another preferred development of the present invention, a temperature of at least one calibration component, which is arranged on a calibration wafer, is modified by means of a wafer support, as a result of which temperature influences on the calibration result are reduced and temperature stabilization of the entire calibration wafer is provided.

In accordance with yet another preferred development of the present invention, structurally identical calibration components on calibration wafers are provided for different arrangements of contact-making connections. In an advantageous manner, the geometry of contact-making connections on the calibration wafer corresponds exactly to the geometry of contact-making connections on the wafer to be tested.

In accordance with yet another preferred development of the present invention, calibration of the test device and testing of wafers to be tested are carried out using identical needle card contact-making devices.

In accordance with yet another preferred development of the present invention, a phase difference unit is used to determine whether a signal on a signal path to be calibrated leads or lags with respect to a reference signal.

In accordance with yet another preferred development of the present invention, signal paths are corrected in accordance with a calibration result with the aid of delay elements.

In accordance with yet another preferred development of the present invention, a phase difference of at least one signal path is quantified and is stored as at least one numerical value in the memory unit.

The calibration wafer according to the invention for calibrating a test device in which wafers to be tested are tested furthermore has:

a) a carrier plate, whose diameter advantageously corresponds to the diameter of the wafers to be tested;
b) at least one calibration component, which is fitted on the carrier plate by means of an adhesive layer;
c) at least one connecting device, which is applied on the at least one calibration component; and
d) contact-making connections, which are applied on the at least one connecting device.

Exemplary embodiments of the invention are illustrated in the drawings and are explained in more detail in the description below.

DETAILED DESCRIPTION OF THE INVENTION

In the figures, identical reference symbols designate identical or functionally identical components or steps.

Figure 5:
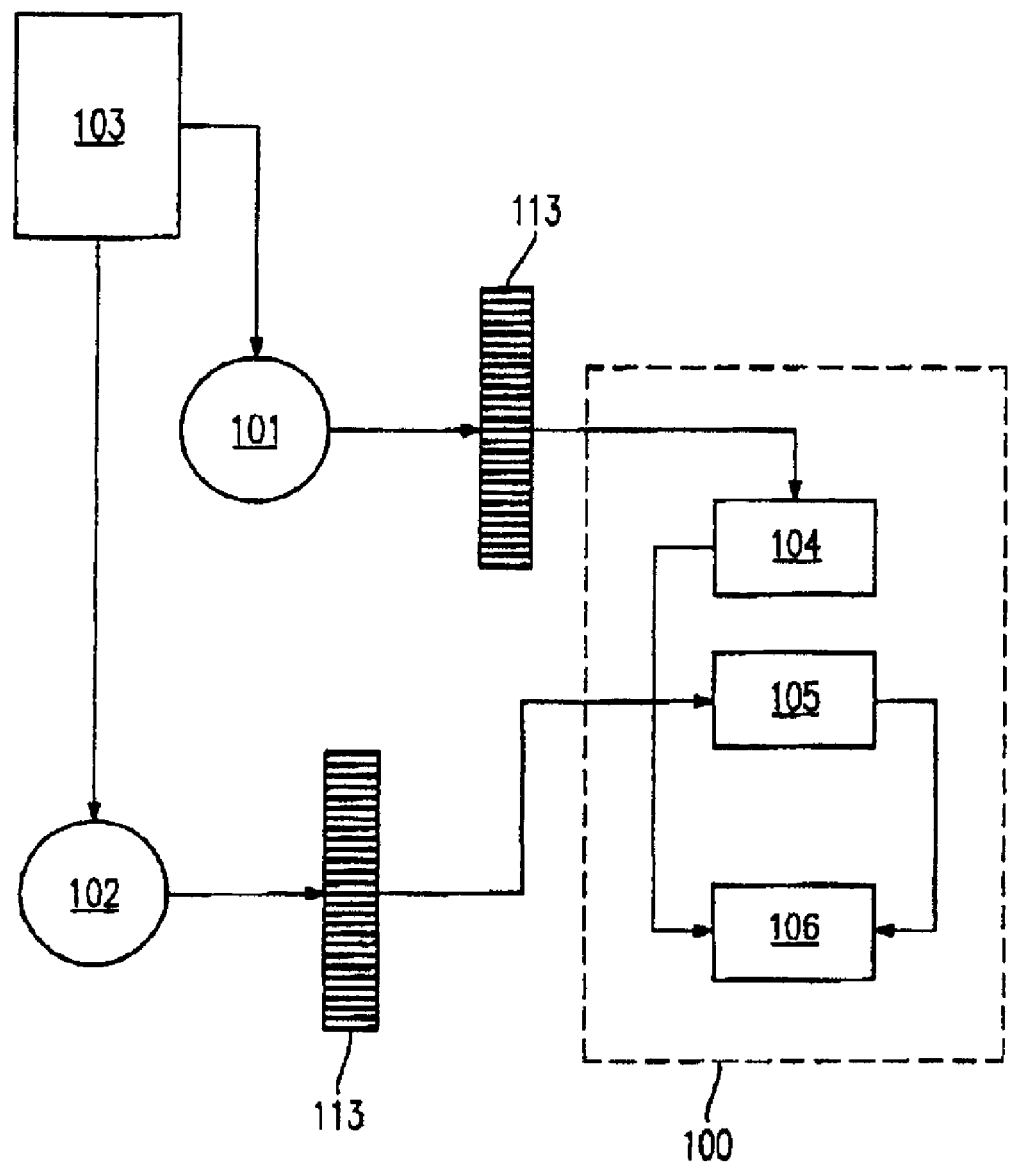
FIG. 5 shows a diagrammatic construction of a test device in accordance with an exemplary embodiment of the present invention, calibration wafers and wafers to be tested being introduced.

FIG. 5 shows an overview block diagram of a test device 100 according to the invention with its essential functional units. In a test sequence control unit 104, a test sequence is controlled in accordance with a predeterminable test program if a wafer 101 to be tested has been connected, by means of a handling unit 103, to the test device 100 via a needle card contact-making device 113.

The test results obtained after such a test sequence are stored in a memory unit 106 and assessed using calibration values obtained from a calibration sequence control unit. According to the invention, by virtue of an identical geometry and identical arrangement of contact-making connections 111 of a calibration wafer 102 (see FIG. 1), a calibration wafer 102 can simply be introduced into a test sequence, a calibration sequence being started with the calibration wafer 102.

The calibration sequence control unit 105 controls the calibration sequence in accordance with a further predeterminable program, the calibration values obtained being stored, as mentioned above, in the memory unit 106. In a manner similar to how the wafer 101 to be tested is connected to the test device 100 via a needle card contact-making device 113, the calibration wafer 102 is connected to the test device 100 via an identical needle card contact-making device 113.

Figure 1A:
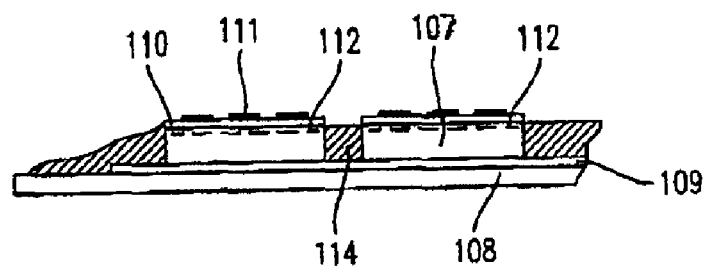
FIG. 1(*a*) shows a cross section through a part of a calibration wafer according to the invention along a line 1–1' of FIG. 1(*b*)
FIG. 1(b) shows a plan view of a section of a calibration wafer on which calibration components are arranged.
Figure 1B:
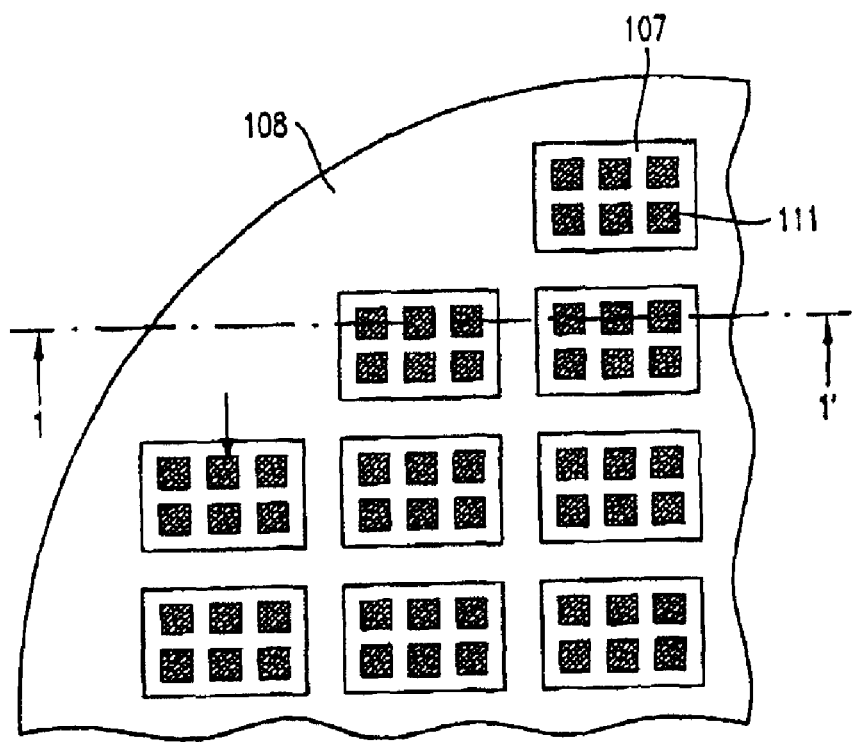

FIG. 1(a) and FIG. 1(b) show the calibration wafer 102 in greater detail. FIG. 1(a) illustrates a cross section of the calibration wafer 102 along a line 1—1' illustrated in FIG. 1(b). FIG. 1(b) illustrates a detail from the calibration wafer 102 (quarter circle segment) with calibration components 107 fitted thereon.

It shall be pointed out that one or more calibration components 107 can be fitted on a carrier plate 108, but the precise number of calibration components 107 depends on the specific design of the calibration wafer 102 with regard to a calibration sequence.

In this case, the carrier plate 108 has a geometry identical to the wafers 101 to be tested (in particular, but not exclusively, an identical diameter). What is thereby achieved is that the calibration wafer 102 can be fed to the test device 100 in an arbitrary, predeterminable manner in a number of wafers to be tested (in a batch), without requiring conversion of the test device 100 or connection of peripheral units. If a calibration wafer 102 is detected during a test sequence in which wafers 101 to be tested are tested, the calibration sequence control unit 105 performs the process control in order to start a calibration sequence in a subroutine.

As shown in FIG. 1(a), the at least one calibration component 107 is applied on the carrier plate 108 by means of an adhesive layer 109. A filling adhesive 114 can advantageously be introduced between the individual calibration components 107 in order to achieve a stability of the calibration wafer 102 and to provide filling of interspaces between individual calibration components 107.

The calibration component connections 112 are through-connected by means of a connecting device 110 (interposer) to externally accessible contact-making connections 111. An essential feature of the contact-making device 110 is that a variable assignment of calibration component connections 112 to contact-making connections 111 can be provided.

In this case, the contact-making connections 111 correspond exactly to those contact-making connections of a wafer 101 to be tested in the test device 100, or a number (batch) of wafers 101 to be tested.

In this way, an existing needle contact-making device 113 (see FIG. 5) can advantageously be used for contact-connecting both the calibration wafer 102 and the wafers 101 to be tested to the test device 100. Consequently, the calibration sequence can be automated in a simple manner.

The connecting device 110 is furthermore provided in a manner such that it can be modified, in order to allow the provision of freely selectable connections between the contact-making connections 111 and the calibration component connections 112. The carrier plate 108, whose dimensions are designed such that it corresponds in terms of its diameter to the wafer 101 to be tested, forms the substrate (baseplate) for the calibration wafer 102. The carrier plate 108 is advantageously formed from the material Invar.

Figure 2:
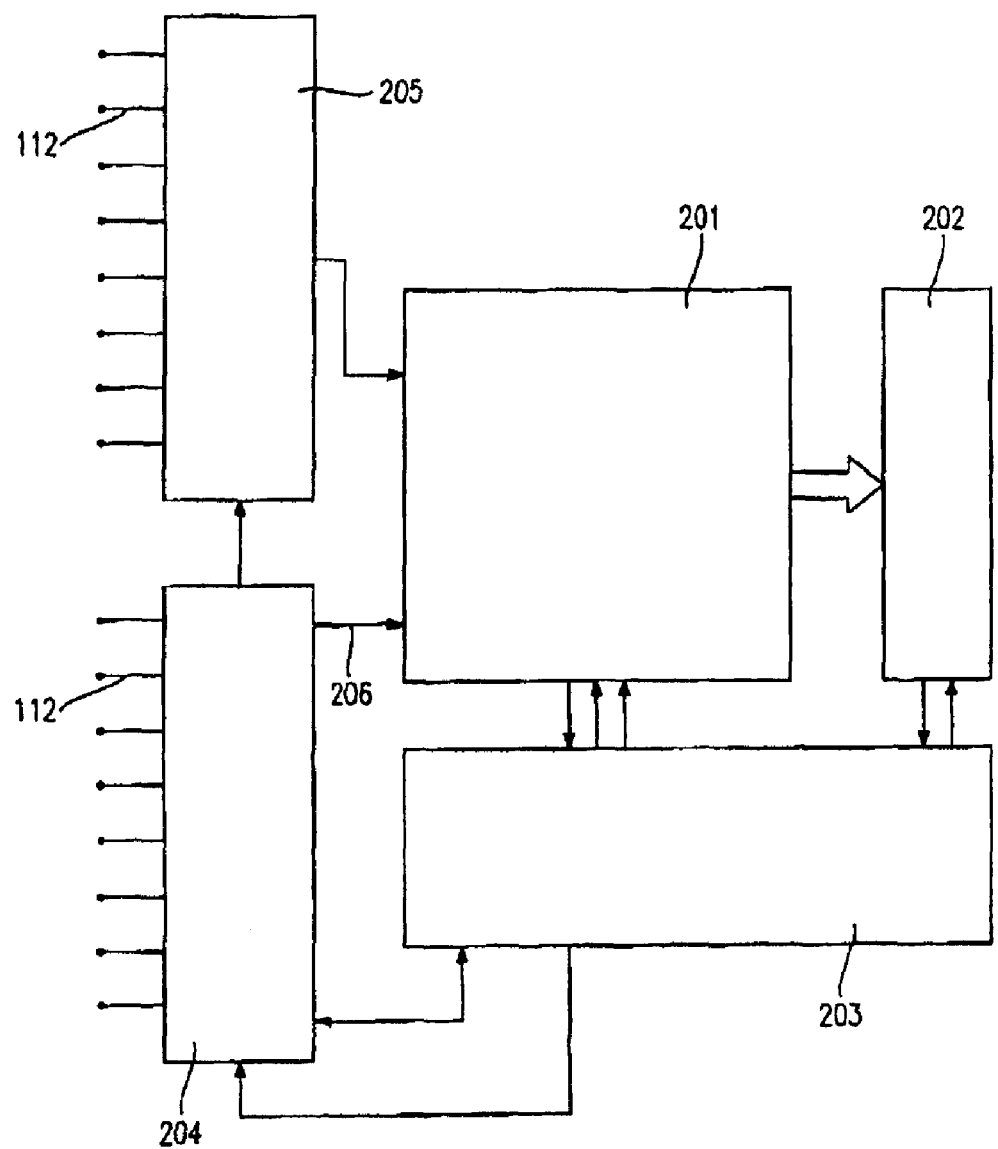
FIG. 2 shows a block diagram of an internal construction of a calibration component.

FIG. 2 shows a calibration component (107), illustrated in FIG. 1(b), in greater detail, particular attention being paid to the internal construction of the calibration element 107. The calibration component connections 112 illustrated in FIG. 1(a) serve, on the one hand, for inputting of signals into an input selection device 205 and, on the other hand, for outputting of signals from an output selection device 204.

200 to 400 individual calibration components 107 are typically arranged on a calibration wafer 102, thereby resulting, given a provision of approximately 20 to 40 contact-making connections 111 per calibration component 107, in up to approximately 16 000 contacts to be realized by a needle card contact-making device 113.

In an advantageous manner the individual calibration components 107 are constructed identically. The input selection device 205 selects the contact-making connections 111 that are through-connected from the calibration component connections 112 via the connecting device 110 from a total number of contact-making connections 111.

A signal path set up by a selected contact-making connection 111 is connected to the phase difference unit 201, in which a phase difference is measured between a reference signal (typically a clock signal 206) and a periodic signal generated from the test device 100 on the signal path to be calibrated (input calibration component connection 112).

In this case, all that can be ascertained is whether the signal on the respective signal path to be calibrated leads or lags with respect to a reference value, or, furthermore, a corresponding phase difference is quantified and output as a numerical value. The measured value of a phase difference is in each case buffer-stored in a digital form in a phase difference register 202.

Through a control by means of a control unit 203, the measured value from the test device is read out from the individual calibration components 107 via the output selection device 204. With the aid of delay elements (not shown), the respective signal paths are corrected in accordance with the measured phase difference values and this process is repeated a number of times until a minimum phase difference is achieved.

Furthermore, provision is made of specific setting elements comprising, for example, input capacitances, delay elements, etc., in order to prevent corruption of signal propagation times through the calibration components 107, an internal signal path length in the calibration components 107 being taken into account.

It shall be pointed out that it is possible to integrate as many phase difference units 201 in a calibration component 107 as there are input calibration component connections 112, and, in the event of a calibration of the output connections, to connect all the output connections simultaneously via drivers to a clock path in order to be able to execute the entire calibration sequence in parallel and thereby to accelerate it further.

Figure 3:
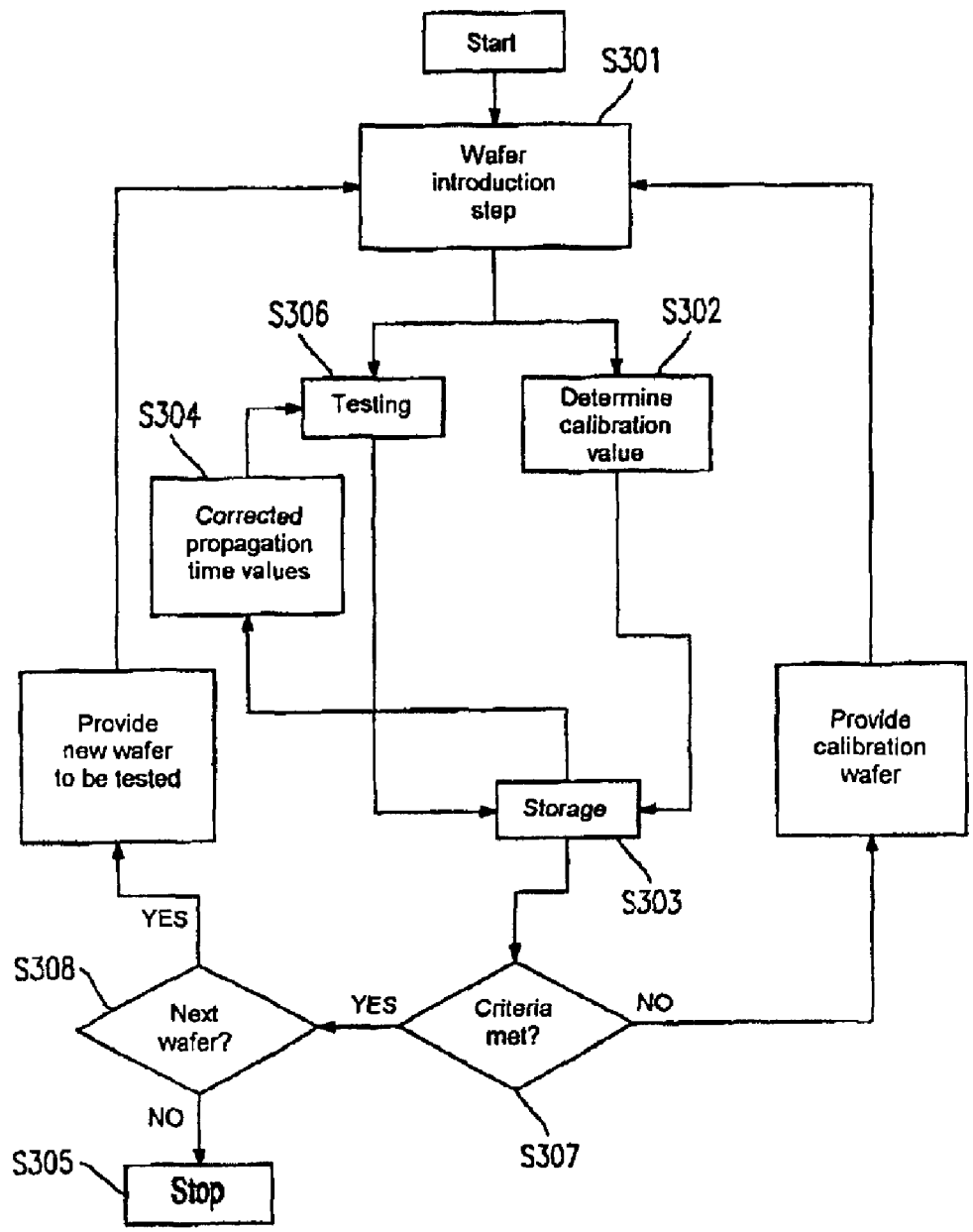
FIG. 3 shows a flow diagram of the method according to the invention for testing wafers to be tested.

Finally, FIG. 3 diagrammatically shows a flow diagram of the method according to the invention for testing wafers to be tested in a test device, the test device being calibratable. After a start of the processing, in a wafer introduction step S301, either a new wafer 101 to be tested or a calibration wafer 102 is introduced, in which case, as mentioned above with reference to FIGS. 1 and 5, for the test device 100 there is generally no difference between a wafer 101 to be tested and a calibration wafer 102.

If a calibration wafer 102 was introduced in step S301, then the processing proceeds to a calibration value determination step S302. In a step S303, the calibration values determined are stored and fed to a step S304, in which corrected propagation time values are calculated. There then follow two interrogation steps S307 and S308, manual intervention by an operator of the test device 100 in these interrogation steps S307 and S308 being possible.

If it is ascertained in step S307 that predeterminable criteria, which can also be introduced manually, are met with regard to calibration of the test device 100, then the processing proceeds to step S308. If it is determined in step S307 that the predeterminable criteria are not met, then the processing returns to step S301 with renewed introduction of a calibration wafer 102, as a result of which a calibration of the test device 100 is repeated.

In step S308, an interrogation is effected to determine whether a wafer 101 to be tested (a further wafer 101 to be tested) is to be tested. If this is the case, then the processing proceeds to step S301, a new wafer to be tested being introduced into the test device 100. The test device identifies a wafer to be tested, as a result of which the processing proceeds, after step S301, to a test step S306, in which testing of the wafer to be tested is carried out in accordance with a predeterminable program provided by a test sequence control unit 104 (FIG. 5).

In this case, account is taken of the corrected propagation time values, fed via step S304, from a preceding calibration of the test device 100. If it is determined in step S308 that no further wafers 101 to be tested are to be introduced into the test device 100, the processing is stopped at a step S305.

The method according to the invention for testing wafers to be tested in a test device, the test device being calibratable, makes it possible, by introduction of a calibration wafer which is composed of active calibration components, to provide a precise calibration, and at the same time a calibration that is simple to integrate in a production process, for test sequences, as a result of which a high-precision calibration of a test device can be effected fully automatically without modifications to a test cell or a test environment.

Figure 4:
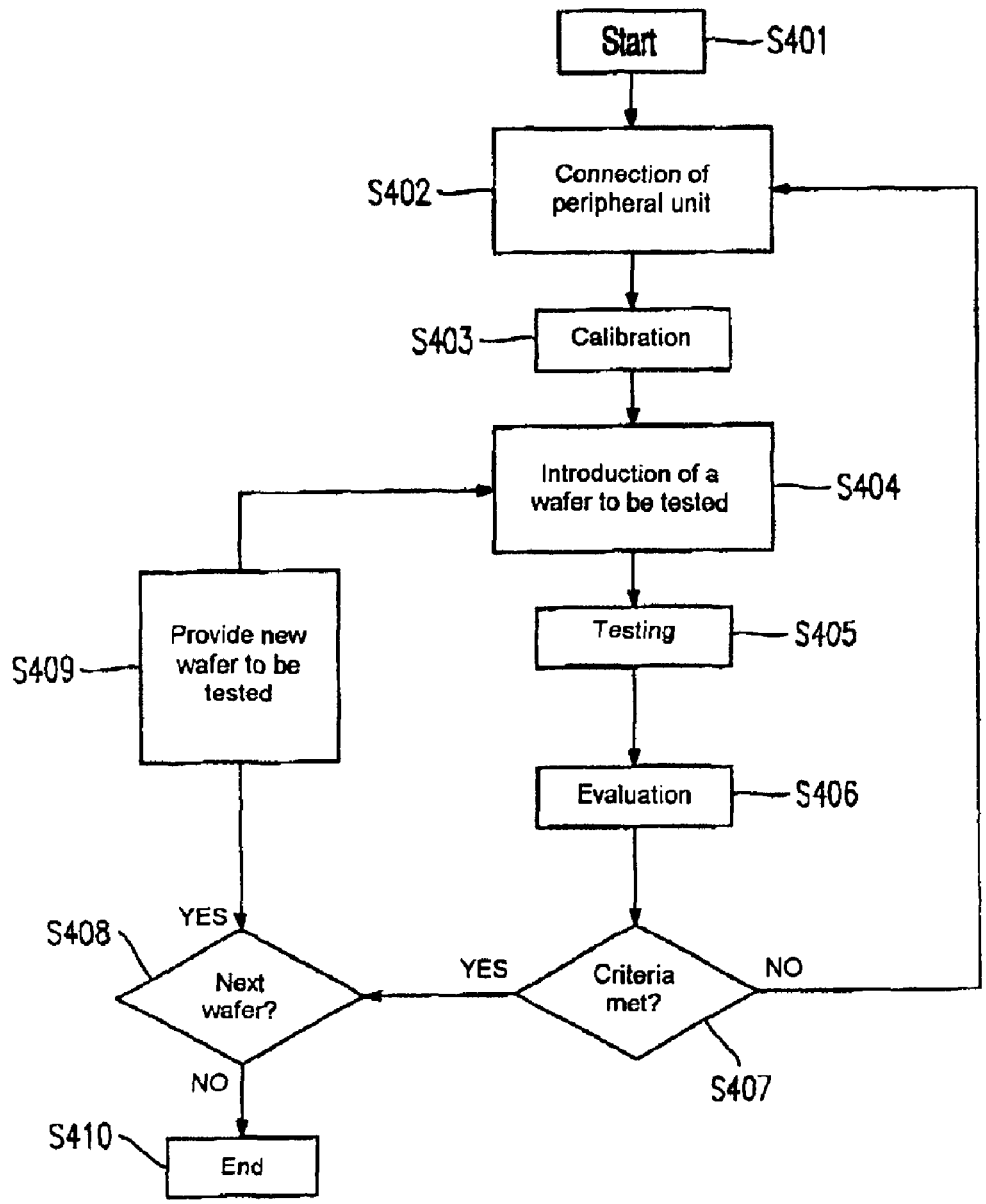
FIG. 4 shows a flow diagram of a conventional method for testing wafers to be tested.

With regard to the flow diagram—illustrated in FIG. 4—of a conventional method for testing wafers to be tested and for calibrating a test device, reference is made to the introduction to the description.

Although the present invention has been described above using preferred exemplary embodiments, it is not restricted thereto, but rather can be modified in diverse ways. List of reference symbols In the figures, identical reference symbols designate identical or functionally identical components or steps.

100 Test device
101 Wafer to be tested
102 Calibration wafer
103 Handling unit
104 Test sequence control unit
105 Calibration sequence control unit
106 Memory unit
107 Calibration component
108 Carrier plate
109 Adhesive layer
111 Contact-making connection
112 Calibration component connection
113 Needle card contact-making device
114 Filling adhesive
201 Phase difference unit
202 Phase difference register
203 Control unit
204 Output selection device
205 Input selection device
206 Clock signal
S301 Wafer introduction step
S302 Calibration value determination step
S303 Storage step
S304 Calibration step
S305 Stop
S306 Test step
S307 First interrogation step
S308 Second interrogation step

What is claimed is:

1. Method for testing wafers to be tested in a test device, in which the test device can be calibrated, having the following steps:
    a) Introduction of a calibration wafer into the test device by means of a handling unit;
    b) Determination of calibration values of the test device by means of a control by a calibration sequence control unit;
    c) Storage of the calibration values determined in a memory unit;
    d) Calibration of the test device by means of the stored calibration values;
    e) Removing the calibration wafer from the calibrated test device such that the calibration wafer can be replaced by a wafer to be tested;
    f) Introduction of the wafer to be tested into the calibrated test device by means of the handling unit; and
    g) Testing of the wafer to be tested in the calibrated test device by means of a control by a test sequence control unit, the stored calibration values being applied.

2. Method for testing wafers to be tested in a test device according to claim 1, wherein the handling unit automatically introduces wafers to be tested and calibration wafers into the test arrangement, or outputs them from the latter, in a test sequence.

3. Method for testing wafers to be tested in a test device according to claim 1, wherein propagation time values are determined as calibration values of the test device.

4. Method for testing wafers to be tested in a test device according to claim 1, wherein phase difference values are determined as calibration values of the test device.

5. Method for testing wafers to be tested in a test device according to claim 1, wherein at least one calibration wafer is introduced into the test device in a predeterminable manner during at least one test sequence in which wafers to be tested are tested.

6. Method for testing waters to be tested in a test device according to claim 1, wherein structurally identical calibration components are provided for different arrangements of contact-making connections.

7. Method for testing wafers to be tested in a test device according to claim 1, wherein calibration of the test device and testing of wafers to be tested are carried out using identical needle card contact-making devices.

8. Method for testing wafers to be tested in a test device according to claim 1, wherein a phase difference unit is used to determine whether a signal on a signal path to be calibrated leads or lags with respect to a reference signal.

9. Method for testing wafers to be tested in a test device according to claim 8, wherein the signal paths are corrected in accordance with a calibration result with the aid of delay elements.

10. Method for testing wafers to be tested in a test device according to claim 1, wherein a phase difference or at least one signal path is quantified and is stored as at least one numerical value in the memory unit.

* * * * *